United States Patent [19]

Kamath

[11] 3,773,553

[45] Nov. 20, 1973

[54] SILICON CARBIDE JUNCTION DIODE

[75] Inventor: G. Sanjiv Kamath, Wellesley, Mass.

[73] Assignee: Norton Company, Worcester, Mass.

[22] Filed: Jan. 4, 1971

[21] Appl. No.: 103,797

Related U.S. Application Data

[63] Continuation-in-part of Ser. Nos. 16,855, March 5, 1970, Pat. No. 3,663,722, and Ser. No. 840,255, July 9, 1969, Pat. No. 3,565,703, and Ser. No. 810,977, March 27, 1969, Pat. No. 3,649,384.

[52] U.S. Cl. .................. 117/201, 117/200, 423/345

[51] Int. Cl. .......................... C01b 31/36, B01j 17/20

[58] Field of Search .................. 23/208 A; 117/200, 117/201; 423/345

[56] References Cited

UNITED STATES PATENTS

| | | | |
|---|---|---|---|
| 3,053,635 | 9/1962 | Shockley | 23/208 A |
| 3,353,914 | 11/1967 | Pickar, Jr. | 23/208 A |

OTHER PUBLICATIONS

Knapton, "Nature," Vol. 175, Page 730 (1955).

*Primary Examiner*—M. Weissman
*Attorney*—Oliver W. Hayes and Jerry Cohen

[57] ABSTRACT

The production of electroluminescent silicon carbide junction diodes is described. These diodes are preferably produced by growth from a silicon carbide or carbon solution in silicon formed between a surface of a p or n-type silicon carbide base crystal and a source of carbon atoms such as a block of solid carbon. The silicon contains one or more p or n-type impurities so that a p-n junction is formed on the crystal. A small quantity of a metal selected from the group consisting of niobium and hafnium is added to the silicon to provide a continued liquid phase despite rapid evaporation of the silicon during the high temperature portion of the growth step when temperatures in excess of 2,400°C are preferably used. This provides a relatively strain-free epitaxial layer (or layers) having optimum electroluminescent properties. When multilayers are grown, the initial layer can be very thin (less than 0.0005 inch) and transparent and the second layer can be opaque and of low resistance due to codoping with boron and aluminum.

3 Claims, No Drawings

SILICON CARBIDE JUNCTION DIODE

This application is a continuation-in-part of my copending applications Ser. No. 16,855, filed Mar. 5, 1970, now U.S. Pat. No. 3,663,722 Ser. No. 840,255, filed July 9, 1969, now U.S. Pat. No. 3,565,703 and Ser. No. 810,977 filed Mar. 27, 1969, now U.S. Pat. No. 3,649,384.

This invention relates to an improved method of forming silicon carbide junction diodes, particularly light-emitting diodes.

SUMMARY OF THE INVENTION

The invention is particularly concerned with silicon carbide junction devices and their production. In one preferred embodiment a light-emitting junction diode is formed by growing an epitaxial *n* layer on the surface of an $n^+$ crystal and then forming a *p* layer on the *n* layer.

A silicon carbide junction diode can be employed as an electroluminescent light source. For such use, it is desired that the junction have the lowest possible forward resistance. Also it is highly desirable that the epitaxial layer be monocrystalline and free of crystalline defects, this being particularly true where another epitaxial layer is to be grown over the first epitaxial layer.

It is a principal object of the present invention to provide such diodes having a high output of visible light from a clear, extremely thin, epitaxial layer which is deposited on an opaque base layer and which forms a *p-n* junction with an opaque, low-resistance epitaxial layer deposited on the clear layer.

Another object of the invention is to provide improved methods of making diodes with a high degree of crystalline perfection and control of impurity content.

These and other objects of the invention will be obvious and will in part appear hereinafter.

For a fuller understanding of the nature and objects of the invention, reference should be had to the following detailed discussion thereof.

The general method of the present invention is described in my copending application Ser. No. 840,255, filed July 9, 1969. In one preferred embodiment a three-layer silicon carbide junction diode is prepared by starting with a single substrate crystal of silicon carbide of one impurity type and growing a layer of silicon carbide containing a lesser concentration of the same impurity type onto one surface of the substrate crystal. The growth then continues with a high concentration of another impurity type to form the *p-n* junction. If the starting crystal has a high "*n*" doping level, it will be relatively opaque. When it is subjected to a diffusion-epitaxial growth treatment wherein an *n*-type layer is grown on one surface of the crystal, the *n* layer will be relatively transparent if it is only lightly doped. If the epitaxial growth then continues with the production of heavily doped opaque *p* layer, there will be produced a *p-n* junction between the clear n layer and the overgrown opaque *p* layer. The thin clear layer will serve as a very narrow window through which the light exits from the junction.

In a preferred form of the invention, the lightly doped "*n*" layer is formed by providing essentially pure silicon between the base "*n*" crystal and a carbon pedestal which supports the crystal in the growth zone. Another supply of silicon containing aluminum, boron and niobium is provided in a groove surrounding the pedestal. The lightly doped epitaxial layer is grown by heating the reaction zone to a relatively low temperature of about 1,500° – 1,700°C for a short period (1–15 minutes) and then the temperature of the zone is raised to about 2,400°C for another short period (about 5 minutes) to achieve rapid growth of a heavily doped p layer due to wetting of the top of the pedestal by heavily doped silicon from the groove. The presence of the niobium in the silicon provides a low vapor pressure liquid which will not evaporate during the final stages of the high temperature portion of the growth process.

In order that the invention may be more fully understood, reference should be had to the following nonlimiting examples:

EXAMPLE 1

A small graphite crucible constructed from high purity graphite (less than 5 ppm ash) was obtained from the Ultra Carbon Corporation. The crucible had the general shape shown in U.S. Pat. No. 3,462,321 to Vitkus issued Aug. 19, 1969. The pedestal 12 was about seven-sixteenths inch in diameter and the groove 14 was about three-eighths inch deep (using the reference numerals in the above patent).

The crucible was provided with a graphite cover and was supported inside of a graphite susceptor chamber 1 ¾ inches in diameter by 1 ¼ inches deep. This susceptor had a graphite cover and was positioned inside of split graphite heat shield provided with a cover. This was surrounded by a quartz tube about 24 inches long and 2 ½ inches in diameter. On the outside of the tube was positioned an induction coil energized by a 50KW radio frequency generator.

The graphite crucible and pedestal used in the layer growth are pretreated with silicon at about 1,900°C to impregnate the internal surface with a silicon carbide layer which enables it to withstand much higher temperatures during subsequent use. After this treatment, a substrate silicon carbide crystal 24 (about 10 mgm) is placed on top of pedestal in the position shown in the above patent. A charge of silicon (600 mgm) containing 10 mgm niobium, 5 mgm aluminum and 2 mgm boron is placed in the groove 14. The substrate crystal 24 contained about 250 parts per million nitrogen and was light green. The bottom surface of the substrate crystal had been polished with one-fourth micron diamond paste. The crystal had been etched in fused KOH at 600°C for about 2 minutes. The "smooth" side was placed down on the pedestal. Resistivity of the crystal was approximately 0.05 ohm cm and the mobility was approximately 70 $cm^2/V$-sec.

The tube was flushed with helium for 5 minutes. After flusing the helium gas flow was controlled at 2 cu. ft/hr and the temperature raised to about 1,400°C for one minute. Thereafter the temperature was raised to 2,400°C for about 5 minutes.

During the high temperature portion of the run, the temperature of the susceptor chamber was recorded at several points by optical pyrometer (corrected) as follows:

| Cover | Top Wall | Bottom Wall |
|---|---|---|
| 2400°C | 2405°C | 2410°C |

These readings were taken by sighting on the susceptor chamber through a slit in the split heat shield.

The resultant "*n*" crystal had a "*p*" layer about 2 mils thick which was grown on the "*n*" base during the high temperature (2,400°C) portion of the cycle. This p layer was very opaque due to the addition of boron and aluminum to the silicon in the groove 14. The resultant product was a diode consisting of a slightly transparent $n$ layer and a $p^+$ layer substantially opaque on top of the transparent $n$ layer. Both the $n$ and $p^+$ layers were provided with contacts in the manner described in the above copending applications.

A diode produced by dicing the $n$-$p^+$ junction of Example 1 gave a 15 × 15 mil die which had a light output of about 300 foot lamberts at a current of 50 ma.

While the exact function of the niobium may vary depending upon the precise point in the process, its principal role is to assure the presence of a liquid phase during the latter portions of growth of the epitaxial layer to provide a relatively strain-free epitaxial layer. At first niobium may be in solution in the silicon, along with dissolved carbon. Then, as the silicon concentration decreases there may be a eutectic mixture (or compound) of silicon and niobium. Lastly, as the amount of silicon present has been drastically reduced due to evaporation the niobium may be present as a liquid layer containing some dissolved silicon and carbon.

In place of the single high temperature growth process used in Example 1 above, it is equally possible to use the two step process of the type described in my copending application Ser. No. 16,855 wherein a first SiC layer is grown at a relatively lower temperature of about 1,500°–1,700°C and the final layer is grown at about 2,400°C. In such a process the presence of the niobium does not have an adverse affect at the lower temperature and has the above described beneficial affects at the high temperature used in the second step.

While niobium has been illustrated in the example as a suitable high melting point metal to be added to the silicon, it is also possible to use hafnium which has the requisite high melting point and large atomic size to provide (a) a liquid phase at about 2,400°C, and (b) only slight tendency for inclusion in the growing epitaxial silicon carbide layer.

Since certain changes may be made in the above process without departing from the scope of the invention herein involved, it is intended that all matter contained in the above description shall be interpreted as illustrative and not in a limiting sense.

What is claimed is:

1. In the method of growing a silicon carbide epitaxial layer on a silicon carbide seed crystal wherein the silicon carbide seed crystal contacts a carbon surface and silicon exists as a molten layer in contact with the seed crystal and the carbon surface, and a temperature gradient exists between the crystal and the molten layer, the seed crystal, carbon surface and silicon layer being maintained at an elevated temperature on the order of 2,400°C during at least part of the epitaxial growth of silicon carbide on a surface of the seed crystal, the improvement which comprises providing in the molten silicon layer a minor amount of a metal selected from the group consisting of niobium and hafnium to provide a molten layer containing said metal between the silicon carbide seed crystal and the carbon surface despite rapid evaporation of silicon at the high temperature.

2. The process of claim 1 wherein the niobium is initially present in the silicon in an amount less than 10 percent of the amount of silicon.

3. The process of claim 1 wherein an initial epitaxial layer of silicon carbide is grown on the silicon carbide seed crystal at a lower temperature on the order of 1,500°–1,700°C.

* * * * *